(12) United States Patent
Grimes et al.

(10) Patent No.: US 10,447,902 B2
(45) Date of Patent: Oct. 15, 2019

(54) CAMERA WITH A HOUSING FOR SHIELDING ELECTROMAGNETIC RADIATION AND MOTOR VEHICLE

(71) Applicant: Connaught Electronics Ltd., Tuam, County Galway (IE)

(72) Inventors: Carol Grimes, Tuam (IE); Colin Patrick Hehir, Tuam (IE)

(73) Assignee: Connaught Electronics Ltd., Tuam, County Galway (IE)

( * ) Notice: Subject to any disclaimer, the term of this patent is extended or adjusted under 35 U.S.C. 154(b) by 0 days.

(21) Appl. No.: 16/061,223

(22) PCT Filed: Dec. 1, 2016

(86) PCT No.: PCT/EP2016/079399
§ 371 (c)(1),
(2) Date: Jun. 11, 2018

(87) PCT Pub. No.: WO2017/097658
PCT Pub. Date: Jun. 15, 2017

(65) Prior Publication Data
US 2018/0287306 A1 Oct. 4, 2018

(30) Foreign Application Priority Data
Dec. 9, 2015 (DE) .................. 10 2015 121 396

(51) Int. Cl.
*H04N 5/225* (2006.01)
*H01R 9/05* (2006.01)
(Continued)

(52) U.S. Cl.
CPC ......... *H04N 5/22521* (2018.08); *G03B 17/02* (2013.01); *H01R 9/0512* (2013.01);
(Continued)

(58) Field of Classification Search
CPC ............ H04N 5/2252; H04N 5/22521; H04N 5/2257; B60R 11/04; H01R 9/0512;
(Continued)

(56) References Cited

U.S. PATENT DOCUMENTS

| 10,079,458 B2* | 9/2018 | Hehir ................. H01R 13/6583 |
| 2011/0096524 A1* | 4/2011 | Kameyama .......... H01R 13/506 |
| | | 361/818 |

(Continued)

FOREIGN PATENT DOCUMENTS

| DE | 10 2014 117 648 A1 | 6/2016 |
| EP | 2284961 A1 | 2/2011 |
| WO | 2016/087227 A1 | 6/2016 |

OTHER PUBLICATIONS

International Search Report issued in PCT/EP2016/079399 dated Jan. 25, 2017 (3 pages).

(Continued)

*Primary Examiner* — Daniel M Pasiewicz
(74) *Attorney, Agent, or Firm* — Osha Liang LLP

(57) ABSTRACT

The invention relates to a camera (2) for a motor vehicle (1) including a housing (5) configured to shield electromagnetic radiation at least in certain areas, including a circuit board (16) disposed in the housing (5), and including an interface device (11) for connecting the camera (2) to the motor vehicle (1), wherein the interface device (11) is electrically connected to the circuit board (16), wherein the interface device (11) includes a coaxial plug (12) with an inner conductor (13) and an outer conductor (14) and the camera (2) has a connecting device (17) for electrically connecting the outer conductor (14) to the housing (5).

13 Claims, 12 Drawing Sheets

Figure 1:
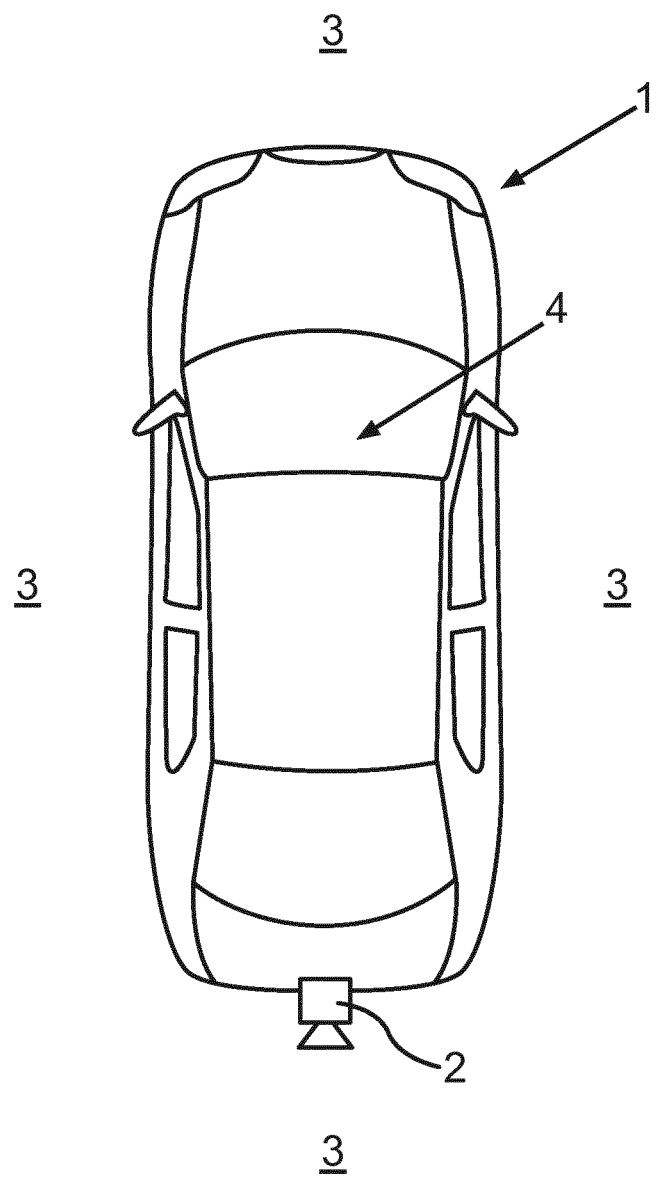

(51) Int. Cl.
  *H01R 13/6596* (2011.01)
  *H01R 13/6597* (2011.01)
  *H01R 24/50* (2011.01)
  *H05K 9/00* (2006.01)
  *G03B 17/02* (2006.01)
  *B60R 11/04* (2006.01)
  *B60R 11/00* (2006.01)

(52) U.S. Cl.
  CPC ....... *H01R 9/0515* (2013.01); *H01R 13/6596* (2013.01); *H01R 13/6597* (2013.01); *H01R 24/50* (2013.01); *H04N 5/2252* (2013.01); *H04N 5/2257* (2013.01); *H05K 9/0058* (2013.01); *B60R 11/04* (2013.01); *B60R 2011/004* (2013.01); *H01R 2201/18* (2013.01); *H01R 2201/26* (2013.01)

(58) Field of Classification Search
  CPC .............. H01R 9/0515; H01R 13/6596; H01R 13/9597; H01R 24/50; H01R 2201/18; H01R 2201/26; H05K 9/0058
  See application file for complete search history.

(56) References Cited

U.S. PATENT DOCUMENTS

| | | | |
|---|---|---|---|
| 2013/0242099 A1 | 9/2013 | Sauer et al. | |
| 2015/0222795 A1* | 8/2015 | Sauer | H04N 5/2257 348/148 |
| 2015/0264234 A1* | 9/2015 | Wang | H04N 5/2254 348/148 |
| 2015/0325964 A1* | 11/2015 | Kunieda | H01R 24/38 439/578 |
| 2015/0327377 A1* | 11/2015 | Mano | H05K 5/0069 361/807 |
| 2016/0268716 A1* | 9/2016 | Conger | H01R 12/716 |
| 2019/0103716 A1* | 4/2019 | Yamazaki | H04N 5/232 |

OTHER PUBLICATIONS

Written Opinion of the International Searching Authority issued in PCT/EP2016/079399 dated Jan. 25, 2017 (7 pages).
German Search Report issued in DE 10 2015 121 396.6 dated Jul. 19, 2016 (7 pages).

\* cited by examiner

CAMERA WITH A HOUSING FOR SHIELDING ELECTROMAGNETIC RADIATION AND MOTOR VEHICLE The invention relates to a camera for a motor vehicle with a housing configured to shield electromagnetic radiation at least in certain areas, including a circuit board disposed in the housing and including an interface device for connecting the camera to the motor vehicle. The interface device is electrically connected to the circuit board. In addition, the invention relates to a motor vehicle with at least one camera.

Cameras for motor vehicles are known from the prior art. Thus, these cameras mostly have a housing, a circuit board and an interface device for connecting the camera to the motor vehicle. Electromagnetic radiation is emitted from further components of the camera such as for example an imaging chip, a video serializer or a current supply. This is undesired and is attempted to shield as possible, for example by the housing, to increase an electromagnetic compatibility (EMC). The electromagnetic compatibility characterizes the usually desired condition that technical appliances do not interfere with each other by undesired electromagnetic effects.

It is the object of the invention to provide a camera, by which the electromagnetic compatibility can be more reliably achieved. It is also the object to form a motor vehicle with such a camera.

According to the invention, this object is solved by a camera as well as by a motor vehicle having the features according to the respective independent claims.

A camera according to the invention for a motor vehicle includes a housing configured to shield electromagnetic radiation at least in certain areas, a circuit board disposed in the housing and an interface device for connecting the camera to the motor vehicle. The interface device is electrically connected to the circuit board. According to the invention, it is provided that the interface device includes a coaxial plug with an inner conductor and an outer conductor and the camera has a connecting device for electrically connecting the outer conductor to the housing.

By the camera according to the invention for the motor vehicle, it becomes possible to ensure the electromagnetic compatibility. In addition, the housing can be particularly effectively electrically connected to the outer conductor by the connecting device. The connecting device also allows reliable compensation for manufacturing inaccuracies of the housing and/or the outer conductor and/or the circuit board. Also, the circuit board can be retained at least partially by the connecting device and thus, for example, retained at an axial position with regard to a longitudinal axis of the coaxial plug. Thus, the housing is for example connected to a ground potential of the circuit board via the outer conductor. By connecting the housing to the ground potential, the housing can particularly effectively shield the electromagnetic radiation. Thus, it can for example occur that the coaxial plug is not concentrically disposed in an opening of the housing. In order to counteract this case of manufacturing inaccuracy, the connecting device is used. The coaxial plug or a coaxial connector serves for detachably connecting coaxial cables. The coaxial plug is coaxially designed like the coaxial cable to be able to provide a low electromagnetic interference and a good electrical shielding. Thus, the coaxial plug can for example be a so called FAKRA connector (FAKRA—Fachkreis Automobil). In particular, the coaxial plug can be formed as a high speed data plug for high speed data transmission.

In particular, the outer conductor of the coaxial plug is formed in the manner of a hollow cylinder. The inner conductor is preferably arranged within the outer conductor. The outer conductor and the inner conductor can be arranged coaxially to each other. However, a longitudinal axis of the inner conductor can also be spaced from a longitudinal axis of the outer conductor, in which case it is not coaxial. The inner conductor in particular features a pin-like form.

The coaxial plug can also comprise an outer conductor and a plurality of inner conductors. In that case, a longitudinal axis of the outer conductor and a longitudinal axis of the respective inner conductor are preferably spaced apart from each other and thus not coaxial. The outer conductor encloses the at least one inner conductor at least partially, in particular completely. In particular, the outer conductor is connected to a first electric potential and the at least one inner conductor is connected to a second electric potential which is different from the first electric potential. The first potential is in particular a ground potential.

In the context of the invention, a coaxial plug in particular denotes a plug which features an outer conductor according to the above characteristics.

In particular, it is provided that the connecting device is formed elastically deformable. By the elastic deformability of the connecting device, deviations in the manufacturing accuracy of the housing and/or the coaxial plug can be compensated for. Thus, despite the manufacturing inaccuracy and deviations of the dimensions of the housing and/or the coaxial plug, respectively, the electrical connection of the outer conductor of the coaxial plug to the housing can be reliably provided.

Preferably, it is envisaged that the connecting device has several spring elements, which exert a spring force on the housing and/or the outer conductor in the assembled state of the camera. By the spring force, the circuit board can also be retained at an axial position with regard to a longitudinal axis of the coaxial plug. In particular, the spring element is a component yielding under load and returning into the original shape after relief, thus behaves elastically restoring. In the assembled state of the camera, thus when the housing is closed and the circuit board is connected to the coaxial plug, the spring force is exerted on the housing and/or the outer conductor by the connecting device. This has the advantage that the connecting device can adapt itself to the distance if a distance from the outer conductor to the housing is greater or less than expected. Furthermore, it is advantageous that the connecting device can also adapt itself if the distance between the outer conductor and the housing varies during the assembled state.

In particular it is envisaged that the connecting device is formed as a ring having a base ring, and the spring elements are arranged on an outer side of the base ring facing away from a longitudinal axis of the ring. By the arrangement of the spring elements on the outer side of the base ring the spring force of the spring elements can be transferred more uniformly and via a larger surface to the housing. Also, with the arrangement of the spring elements on the outer side a larger number of spring elements can be arranged on the base ring than is possible with the spring elements being arranged on the inner side of the base ring. Thus, the electrical connection between the housing and the interface device can be established more effectively and the electromagnetic shielding can be effected more reliably.

Further, it is in particular envisaged that the spring elements are arranged radially protruding from the base ring, and are oriented at an angle relative to a plane, in which the base ring extends. By the spring elements radially protruding from the base ring, the ring is designed to be crown cap-like. The angle relative to the plane preferably amounts to 30° to 80°, in particular 30° to 50°. The spring elements are arranged at the angle in such a way at the base ring that these extend at the angle in the direction of the inside of the housing and thus are directed in particular away from the circuit board. By the spring elements arranged at the angle the spring force, which is emitted by the pressure of the housing to the spring elements and thus the base ring, can be emitted in such a way that a force acting upon the interface device and thus the circuit board is only strong enough for the circuit board not to be damaged, but still to be retained at the axial position. The connecting device formed as ring consequently with the spring elements can compensate for a tolerance between the interface device and the housing, in particular in the direction of the longitudinal axis of the ring, and at the same time observe a maximum pressure load of the circuit board.

Further, it is in particular envisaged that the spring elements, which are oriented at the angle relative to the plane, each have an edgeless spring element surface. The edgeless spring element surface can also be referred to as devoid of bends. This means that the spring element surface is formed to be in particular smooth. By the edgeless spring element surface the spring elements can for instance be bent upwards in a simple way at the angle from the base ring. Further, the spring element can, for example, be made of metal sheet and feature a predetermined material strength.

In a further embodiment it is in particular envisaged that the spring elements each have a first spring element part, which is oriented radially outward at a first angle relative to the longitudinal axis of the ring, and from an end of each of the first spring element parts, which faces away from the base ring, a second spring element part extends, which is oriented at a second angle larger than the first angle relative to the longitudinal axis of the ring. By the second spring element part a larger contact area of the spring element on the inner surface of the housing can be achieved than is the case if merely the first spring element part were provided. Thus, the first angle is for instance designed to be from 10° to 60°, preferably 40° to 60°, in particular 45°, whilst the second angle is preferably from 0° to 30°, in particular from 0° to 20°. The first angle and the second angle could be designed in such a way that the housing applies a force upon the second spring element part in the assembled state of the camera in such a way that it extends in a plane perpendicular to the longitudinal axis of the ring. Thus, the ring with the second spring element part rests with a larger surface upon the inner surface of the housing than would be the case if the second spring element part were not provided. The electrical connection between the connecting device formed as ring and the housing can thereby be configured more effectively and reliably.

Preferably it is envisaged that the spring elements are arranged circumferentially around the longitudinal axis of the ring and between each of the spring elements a clearance extends radially outward, in particular starting at a distance, from the base ring. By the clearance the spring elements are arranged in a spaced manner in the circumferential direction of the longitudinal axis of the ring. Thereby the spring elements can be elastically moved independently of each other. Thus, also a tolerance for an uneven inner surface of the housing can be provided. Thereby for instance certain spring elements can be moved elastically to a larger degree than remaining spring elements. In particular in a further embodiment it can be envisaged that the clearance is formed only at a distance from the base ring. Thereby, for instance influence can be exerted upon the spring force or the force required for elastic deformation of the spring elements. With increasing distance the force required for elastic deformation of the spring elements increases. In particular the distance, however, can also amount to zero and the clearance extends radially outward starting directly from the base ring.

Furthermore, it is preferably provided that the connecting device surrounds the outer conductor at least in certain areas. This means that the connecting device is preferably disposed around the outer conductor. Thus, the connecting device is preferably located on the side of the outer conductor facing away from the inner conductor. It is advantageous that the coaxial plug can therefore be connected to the motor vehicle in a manner undisturbed or unimpeded by the connecting device. Furthermore, the outer conductor can be prevented from establishing an electrical connection to the inner conductor via the connecting device. In particular, thereby, the ground potential of the outer conductor does not get into connection with the inner conductor. In addition, an assembly of the connecting device can be simply performed.

In a further embodiment, it is preferably provided that the connecting device is formed as a serrated washer. The connecting device can be formed in the manner of a serrated washer. The serrated washer can for example be internally and/or externally toothed. However, the serrated washer preferably has the teeth on an inner side to thereby have good retention to the outer conductor. The teeth of the serrated washer can for example be distorted and thus be formed as the spring element. Additionally or alternatively, however, the teeth can also be bent in such a way that they protrude from a plane perpendicular with respect to the rotational axis of the serrated washer to function as the spring element. The teeth can be bent out in uniform manner, thus only to one direction of the rotational axis of the serrated washer, or else in crossed manner, thus for example alternately one tooth into the one direction of the rotational axis and another tooth into the other direction of the rotational axis. The teeth of the serrated washer can therefore exert a spring force in the axial direction of the outer conductor in the assembled state of the camera, thus when the serrated washer surrounds the outer conductor and the spring elements are biased. In the assembled state, the teeth of the serrated washer abut the inner side of the housing and thus establish the electrical connection of the outer conductor to the housing. The serrated washer rests on the outer conductor and/or is in contact with or electrically connected to it via the teeth of the serrated washer.

Furthermore, it can be provided that the connecting device has a first annular element and a second annular element, which are disposed spaced from each other, wherein the first annular element and the second annular element each have a through-opening disposed aligned with each other, and wherein the first annular element and the second annular element are connected by the at least one spring element. In assembling the camera, the connecting device with the through-openings is fitted onto the outer conductor such that the connecting device surrounds the outer conductor. By the at least one spring element a spring force can be received and/or delivered in axial direction with respect to the coaxial plug. With assembled camera, thus closed housing, the spring element is compressed because the first annular element abuts the circuit board on the first end of the outer conductor in form-fit manner, and the second annular element oppositely abuts an inner side of the housing in form-fit manner. Thus, a particularly reliable electrical connection between the housing and the outer conductor can be provided.

In particular, it is provided that the at least one spring element has a predetermined curvature. The predetermined curvature is preferably determined such that a distance including a predetermined manufacturing tolerance between the housing and the outer conductor near the circuit board can be covered or bridged with the connecting device. Furthermore, the predetermined curvature is preferably adapted such that the connecting device is elastically deformable in the assembled state of the camera. Thus, a spring force can for example be permanently exerted on the housing and the outer conductor by the connecting device.

In a further embodiment, it is preferably provided that the connecting device has a plurality of spring elements disposed distributed along a circumferential direction of the connecting device. In particular, the spring elements can be disposed uniformly distributed to each other along the circumferential direction. By the plurality of spring elements, the force exerted on the connecting device by mounting or assembling the housing and the outer conductor can be uniformly received. By the plurality of spring elements, increased safety in electrically connecting the outer conductor to the housing can also be provided. For example, if one of the spring elements fails, thus, the spring force and thus the electrical connection of the outer conductor to the housing can further be provided.

Furthermore, it can be provided that the outer conductor includes a first partial element and a second partial element, which is disposed between the first partial element and the circuit board, wherein a first outer radius of the first partial element is less than a second outer radius of the second partial element. The first partial element in particular establishes the connection to a plug connected to the coaxial plug in order to for example connect the camera to the motor vehicle. The second partial element has a contact area extending in radial direction with respect to the coaxial plug due to the larger second outer radius. The contact area is preferably provided to set the connecting device on the side of the outer conductor. A particularly reliable electrical connection of the outer conductor to the housing can be provided by the second partial element.

Furthermore, it can be provided that the second annular element of the connecting device is electrically connected to the second partial element of the outer conductor. Thus, a particularly reliable electrical connection between the outer conductor and the housing can be provided by means of the connecting device. The second annular element can thus rest on a contact area of the second partial element disposed radially to the coaxial plug and receive the force arising in assembling the camera in axial direction of the coaxial plug from there.

In a further embodiment, it is preferably provided that the housing has a receiving element on an inner side facing the circuit board, in which the connecting device is disposed at least in certain areas and which is electrically connected to the connecting device. Thus, the receiving element of the housing can for example ensure that the connecting device has a secure retention at the location, at which the connecting device is connected to the housing. This can have an advantage in the assembly of the housing and provide a secure electrical connection of the outer conductor to the housing. By the receiving element, a surface, by which the housing is connected to or in contact with the connecting device, can be increased. Thus, the connecting device preferably abuts the housing for example not only with the first annular element, but additionally or alternatively with the at least one spring element of the connecting device. The electrical connection of the outer conductor to the housing and thus the electrical connection of the housing to the ground potential of the circuit board can therefore be particularly reliably and robustly provided.

In a further embodiment, it can be provided that the housing includes a first housing part and a second housing part. Thus, the first housing part is electrically connected to the outer conductor and thus to the ground potential of the circuit board via the connecting device. The second housing part is in turn electrically connected to the first housing part for example via screws and thus also electrically connected to the ground potential. Thus, the entire housing is preferably electrically connected to the ground potential and can particularly effectively shield the electromagnetic radiation from the components within the camera and prevent it from exiting the housing. In the same manner, by the housing, electromagnetic radiation can be prevented from entering the housing from the outside. In this manner, the electromagnetic compatibility can be achieved.

For example, the housing can be manufactured from aluminum. Additionally, the interface device can have an electrically insulating element manufactured from plastic, for example. However, the interface device can also be formed without the electrically insulating element. The interface device in particular serves for data transfer between the camera and a communication bus of the motor vehicle. The camera can also be supplied with electrical energy from an on-board network of the motor vehicle via the interface device.

Furthermore, it can be provided that the interface device is configured as a high-speed data plug, with a data transmission rate of at least 100 Mbit/s, in particular with a data transmission rate of at least 1 Gbit/s. In particular, the coaxial plug can be formed as a high speed data plug. Thus, the high speed data plug is for example a component of a connector system providing an impedance-controlled 100 Ohm connection to transfer data with high speed. The high speed data plug can for example be based on a star quad principle and feature four inner conductors. Spurious signals by crosstalk and external interference sources are thus suppressed. Thus, a particularly effective connection with little spurious signals is advantageous.

In particular, it is provided that the outer conductor is electrically connected to a ground potential of the camera. The ground potential can for example be provided by the circuit board and/or by the motor vehicle. By electrically connecting the outer conductor to the ground potential of the camera, the housing of the camera can also be electrically connected to the ground potential of the camera by the connecting device. Thus, hereby, the electromagnetic compatibility is also again ensured.

The invention also includes a motor vehicle with a camera according to the invention or an advantageous implementation thereof. The motor vehicle is in particular formed as a passenger car.

The preferred embodiments presented with respect to the camera according to the invention and the advantages thereof correspondingly apply to the motor vehicle according to the invention.

Further features of the invention are apparent from the claims, the figures and the description of figures. The features and feature combinations mentioned above in the description as well as the features and feature combinations mentioned below in the description of figures and/or shown in the figures alone are usable not only in the respectively specified combination, but also in other combinations or alone, without departing from the scope of the invention. Thus, implementations are also to be considered as encompassed and disclosed by the invention, which are not explicitly shown in the figures and explained, but arise from and can be generated by separated feature combinations from the explained implementations. Implementations and feature combinations are also to be considered as disclosed, which thus do not have all of the features of an originally formulated independent claim.

Below, embodiments of the invention are explained in more detail based on schematic drawings.

Figure 2:
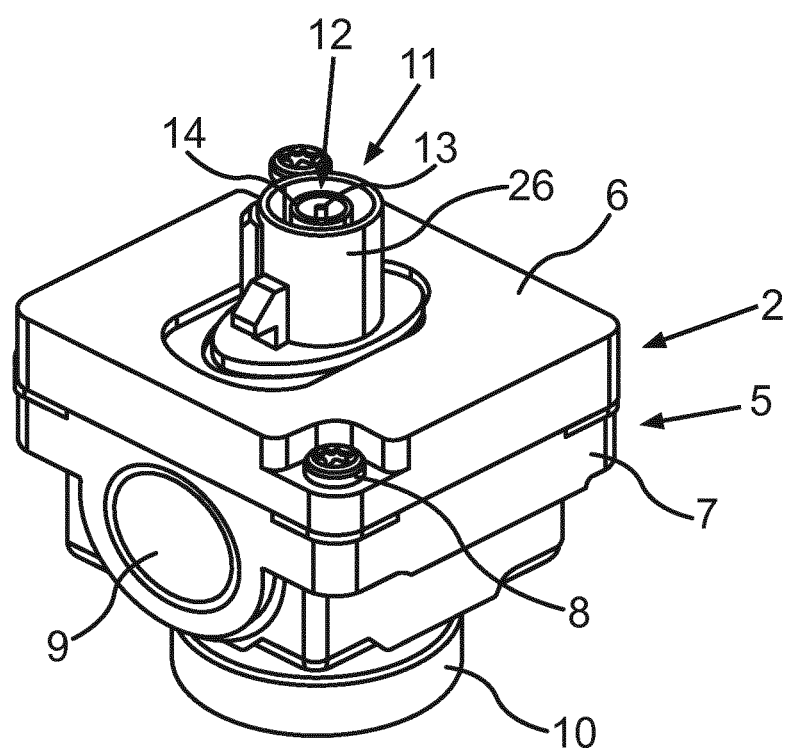
Figure 3:
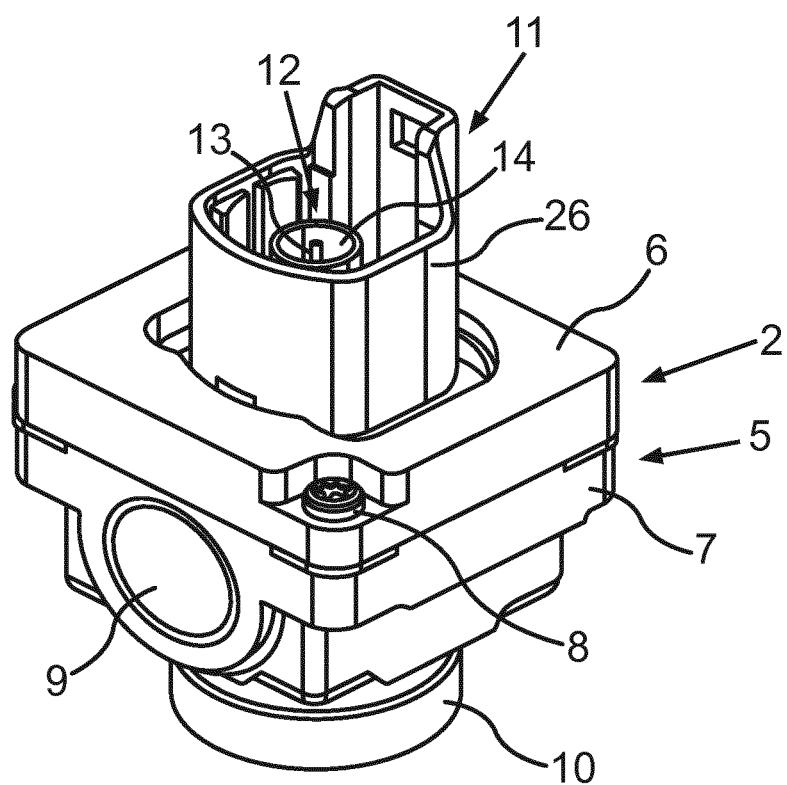
Figure 4:
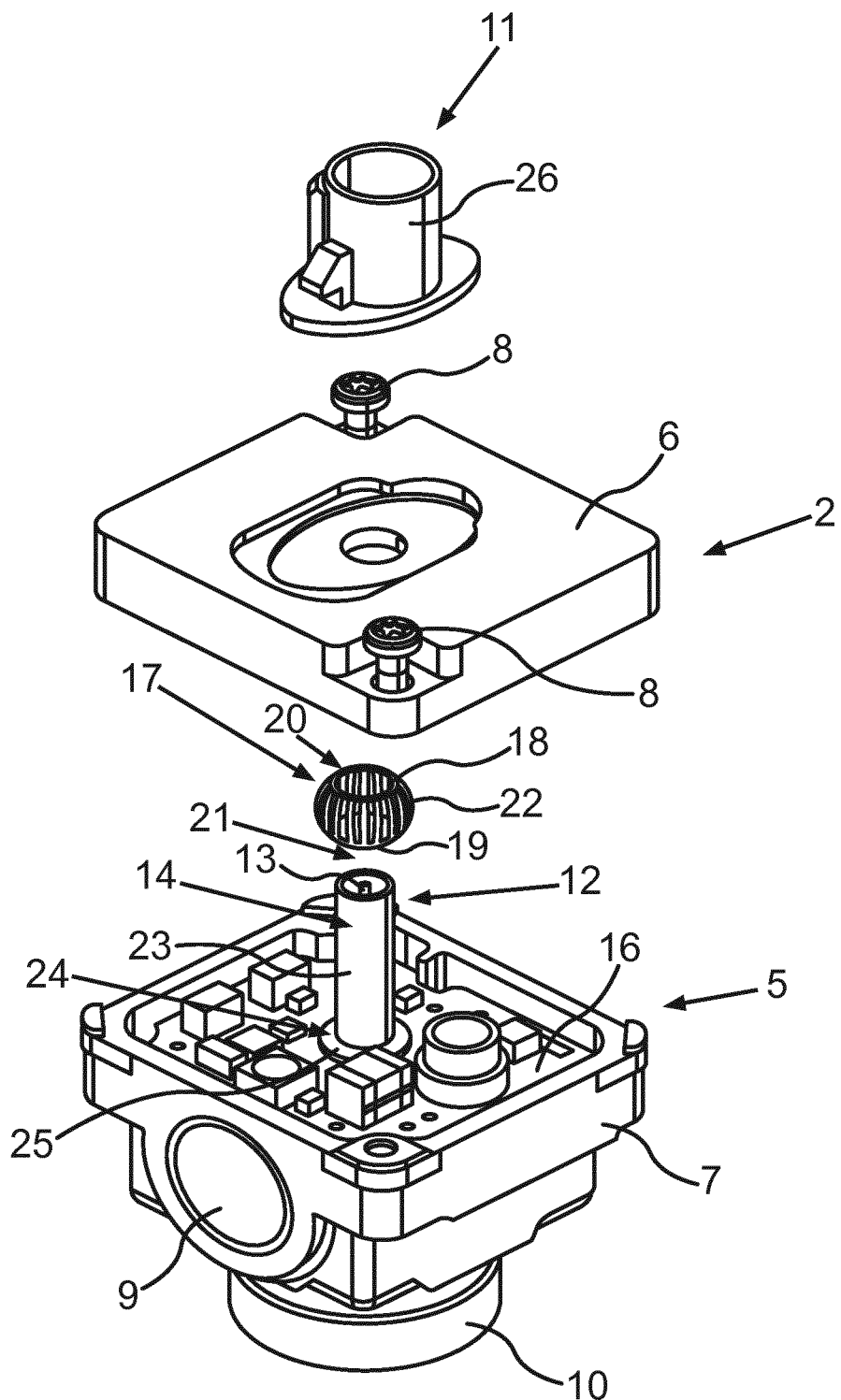
Figure 5:
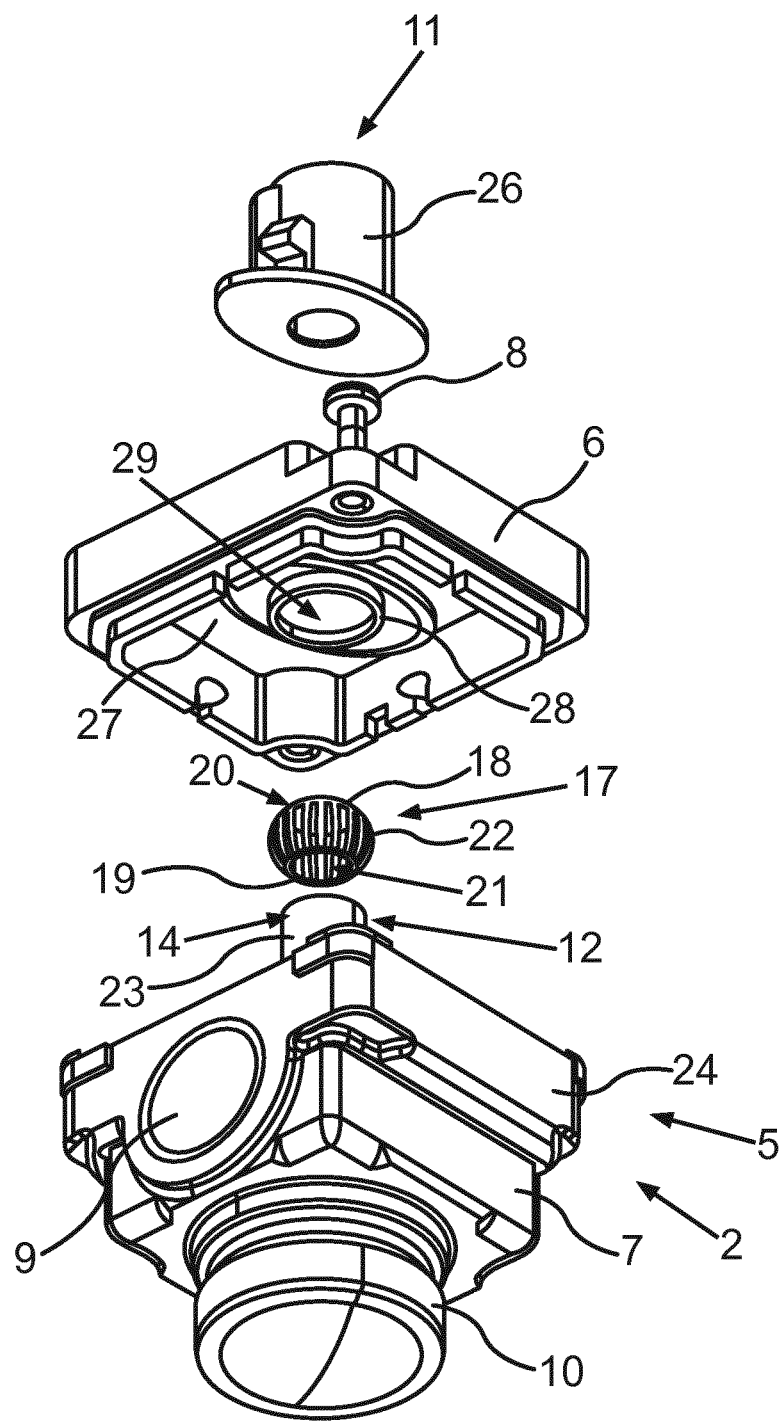
Figure 6:
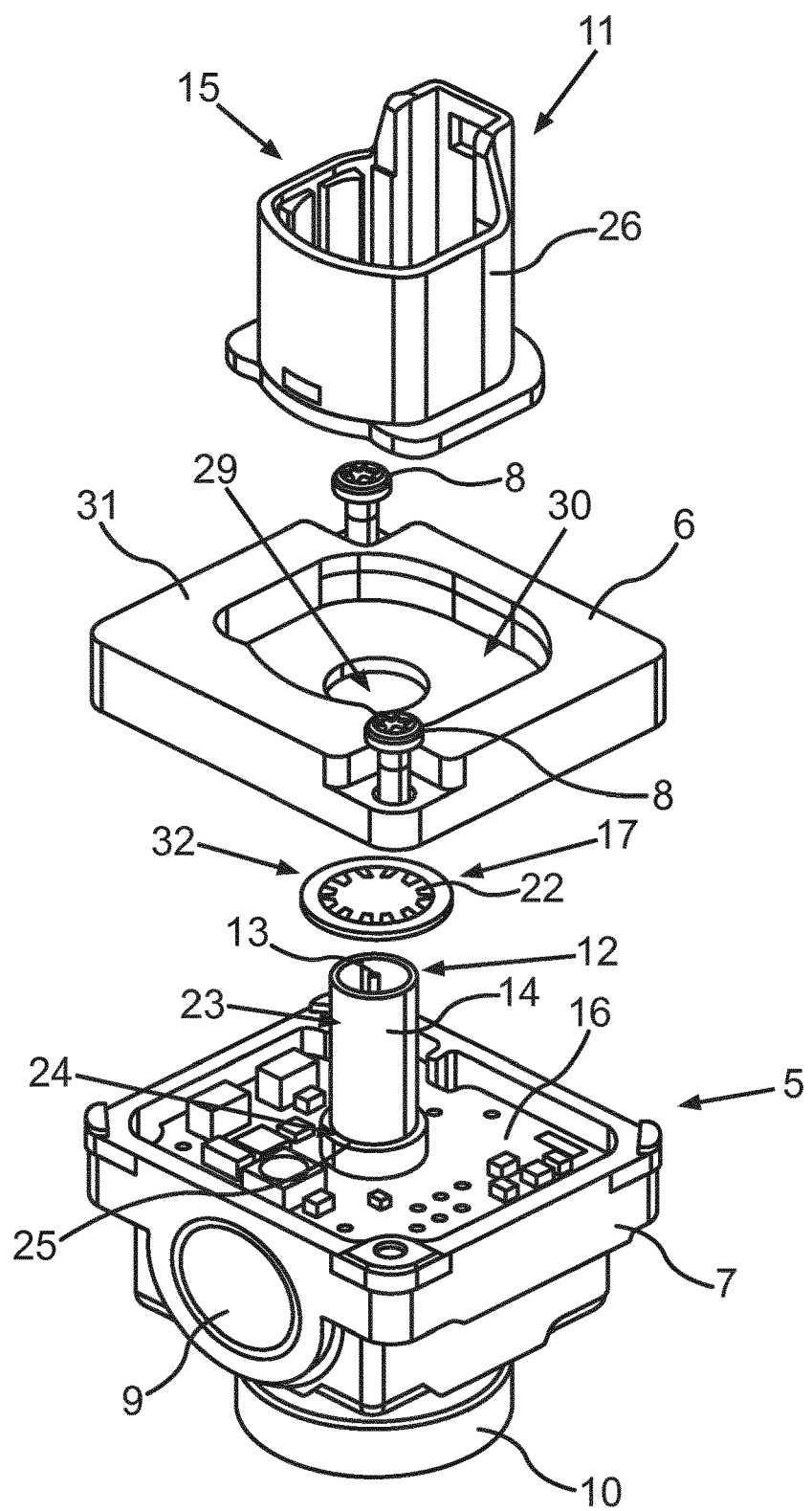
Figure 7:
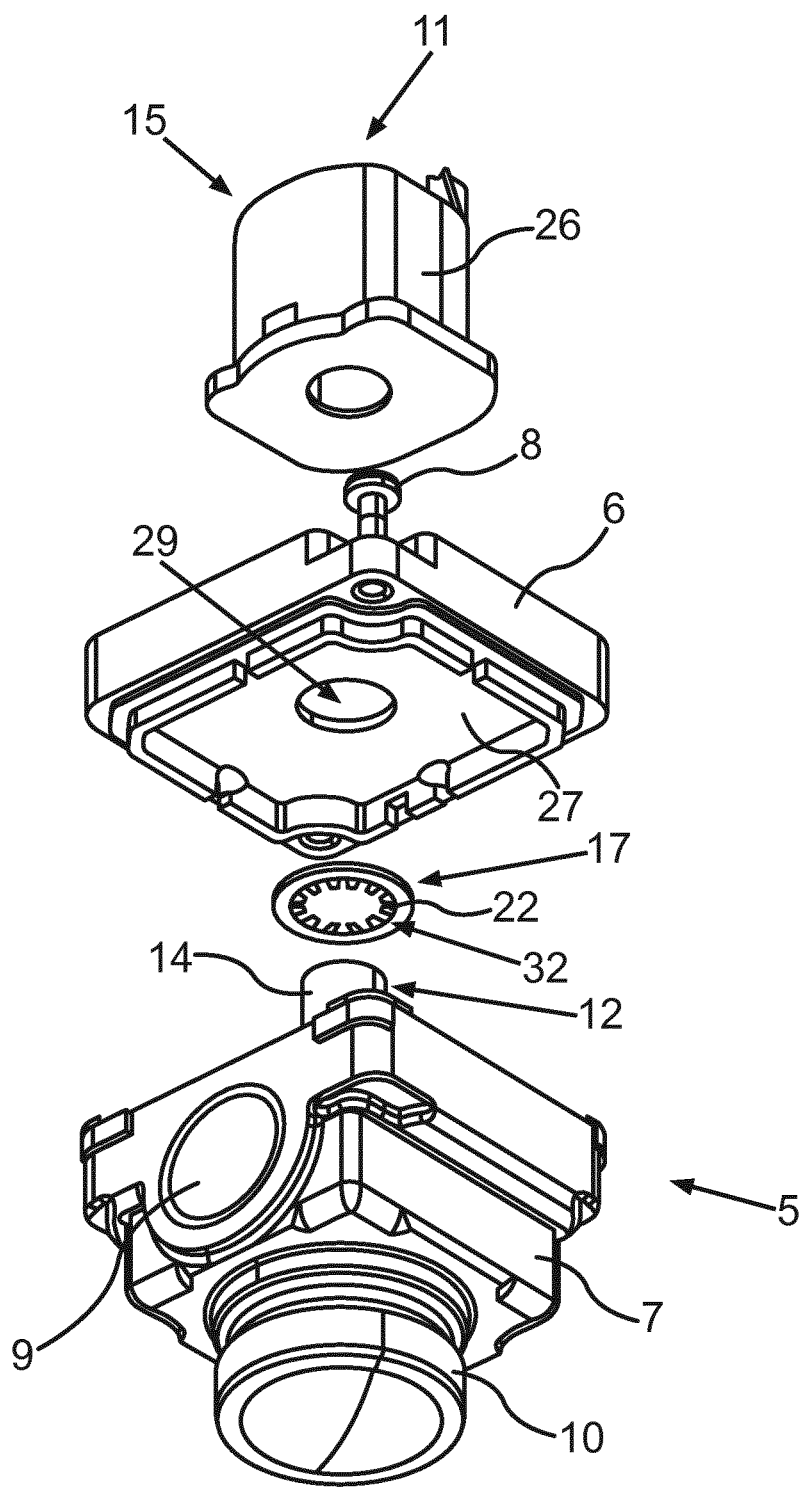
Figure 8:
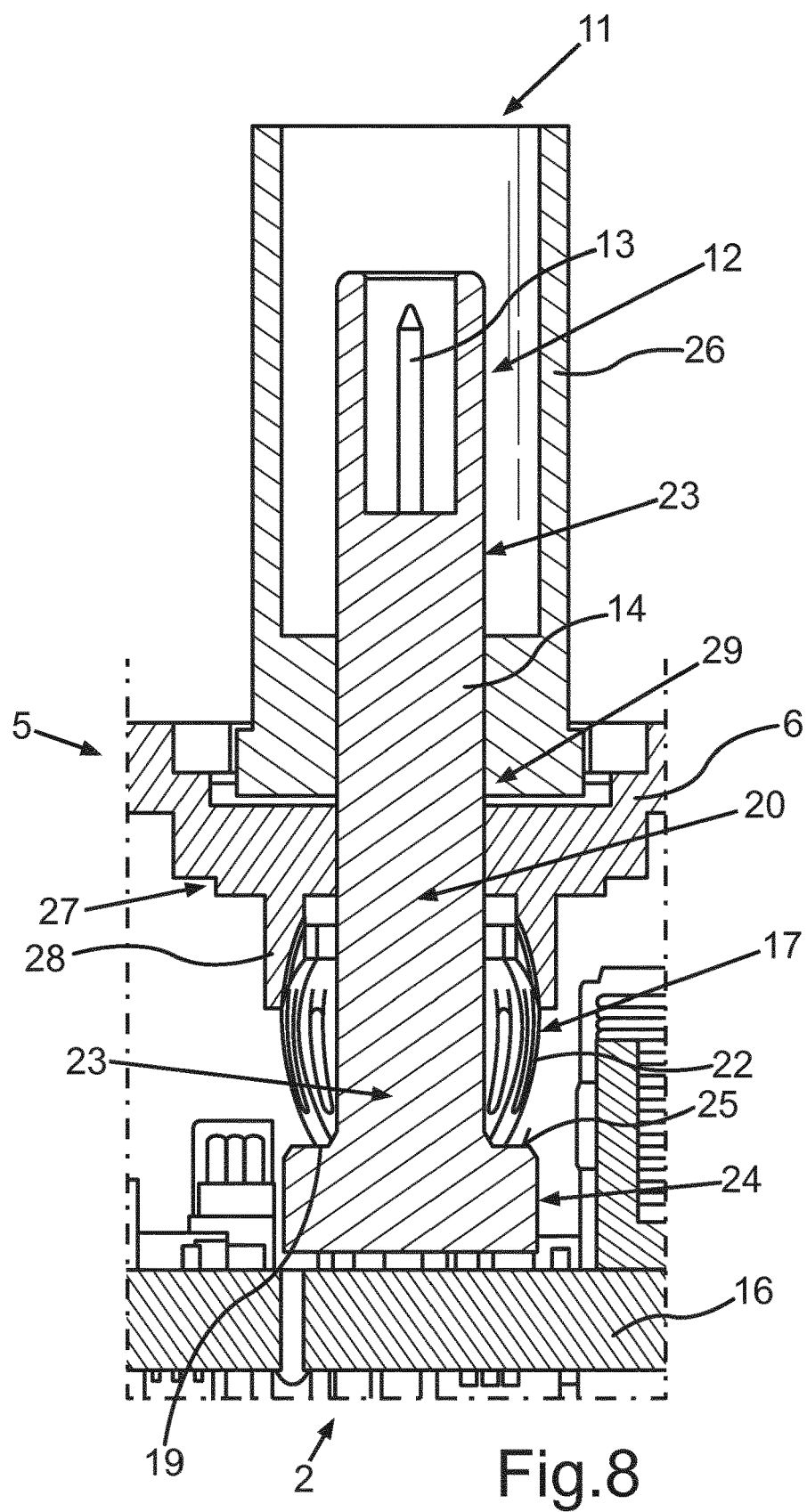
Figure 9:
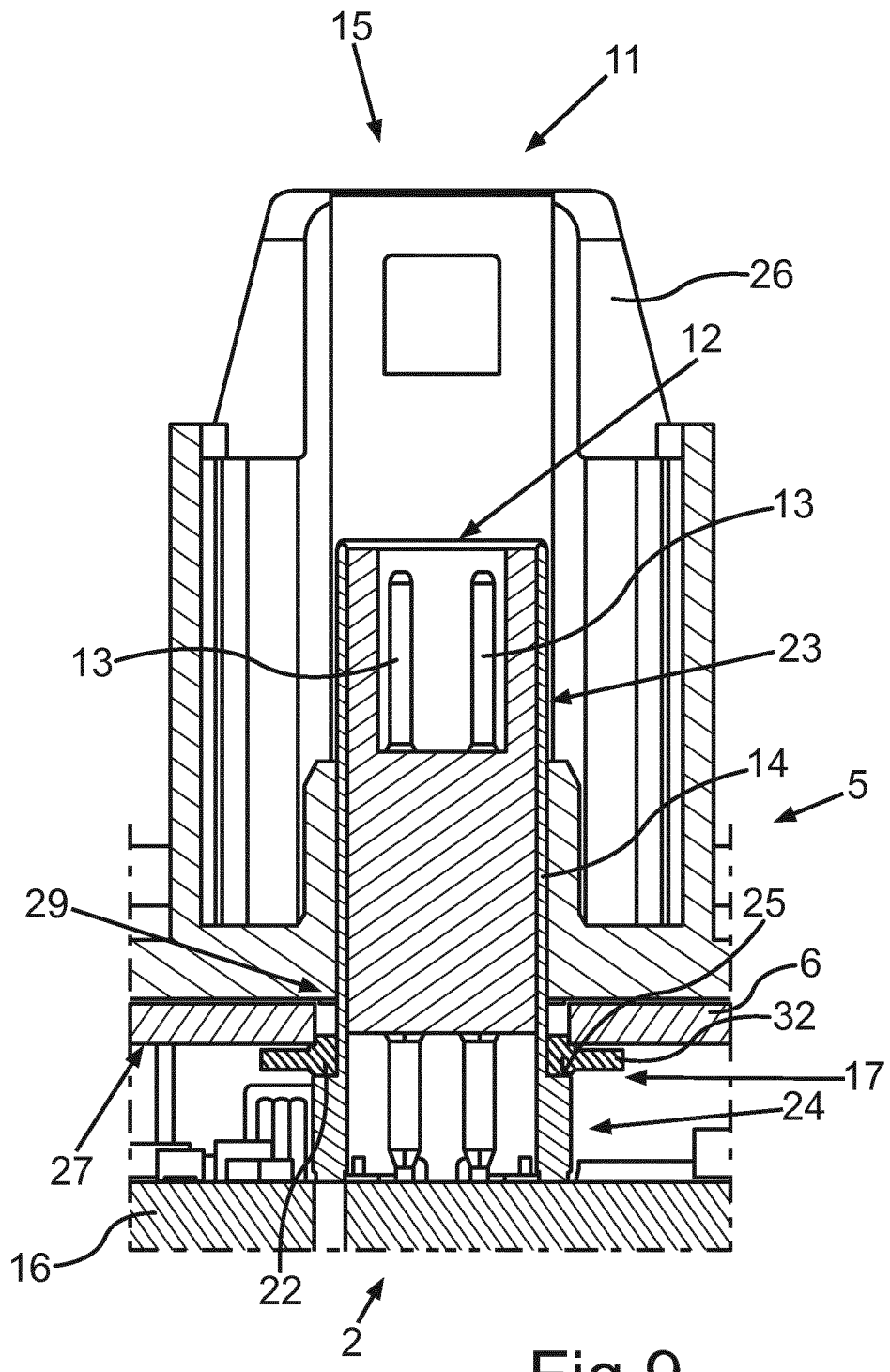
Figure 10:
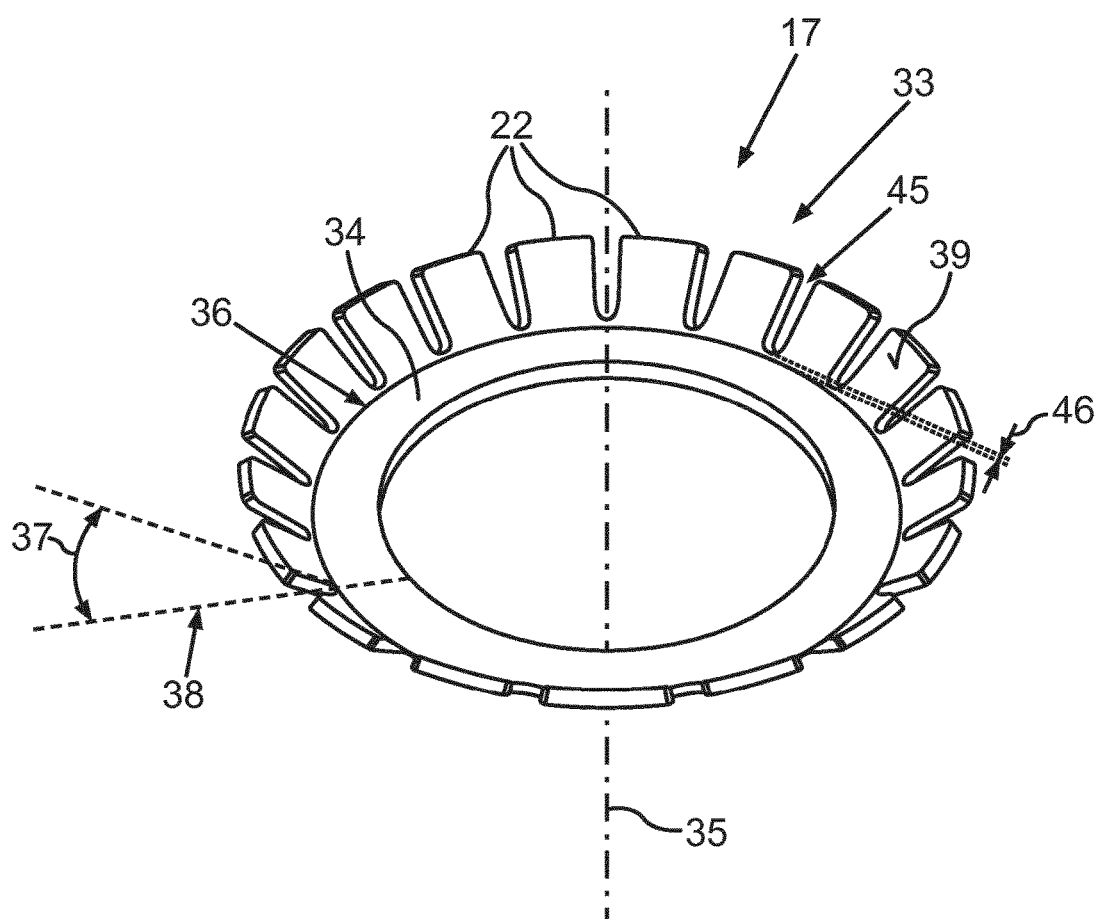
Figure 11:
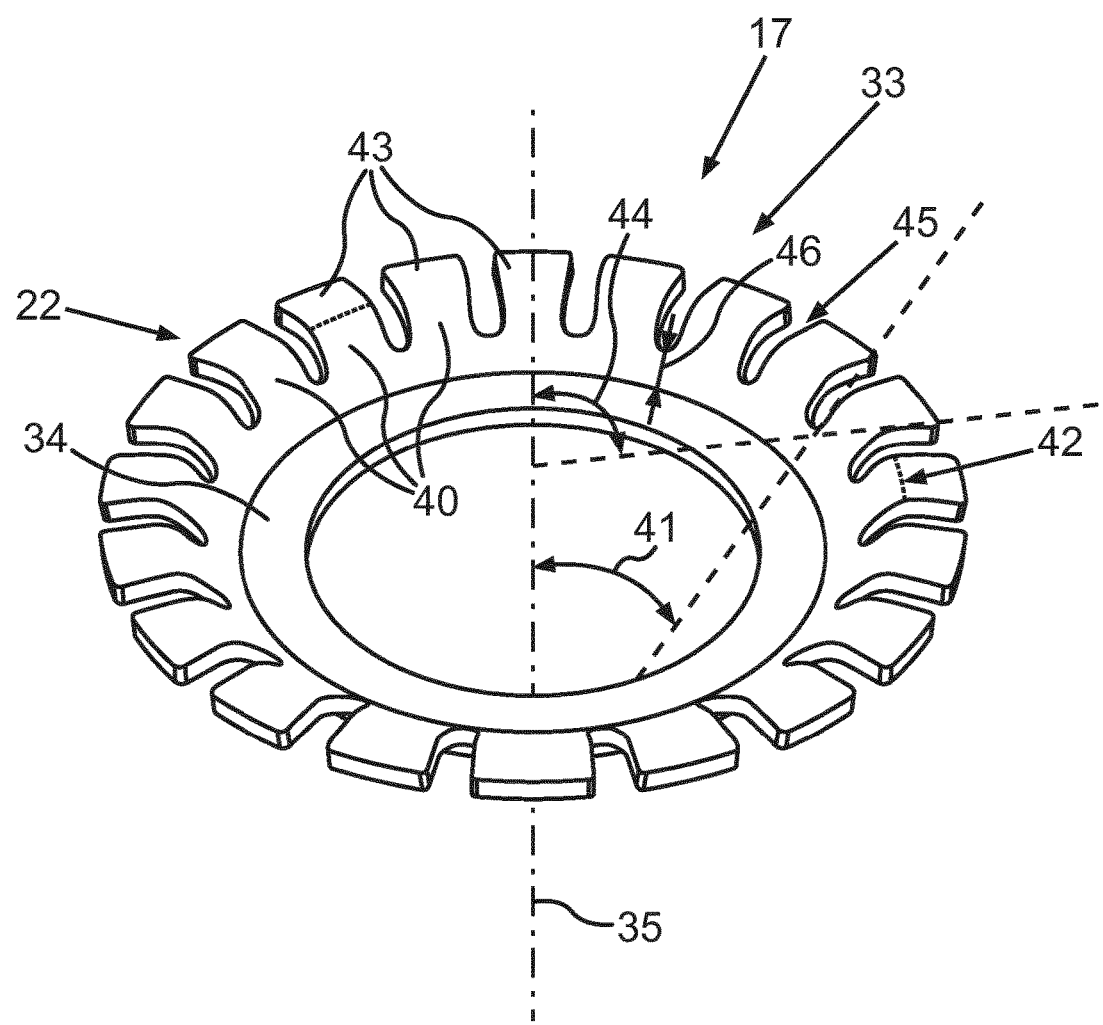
Figure 12:
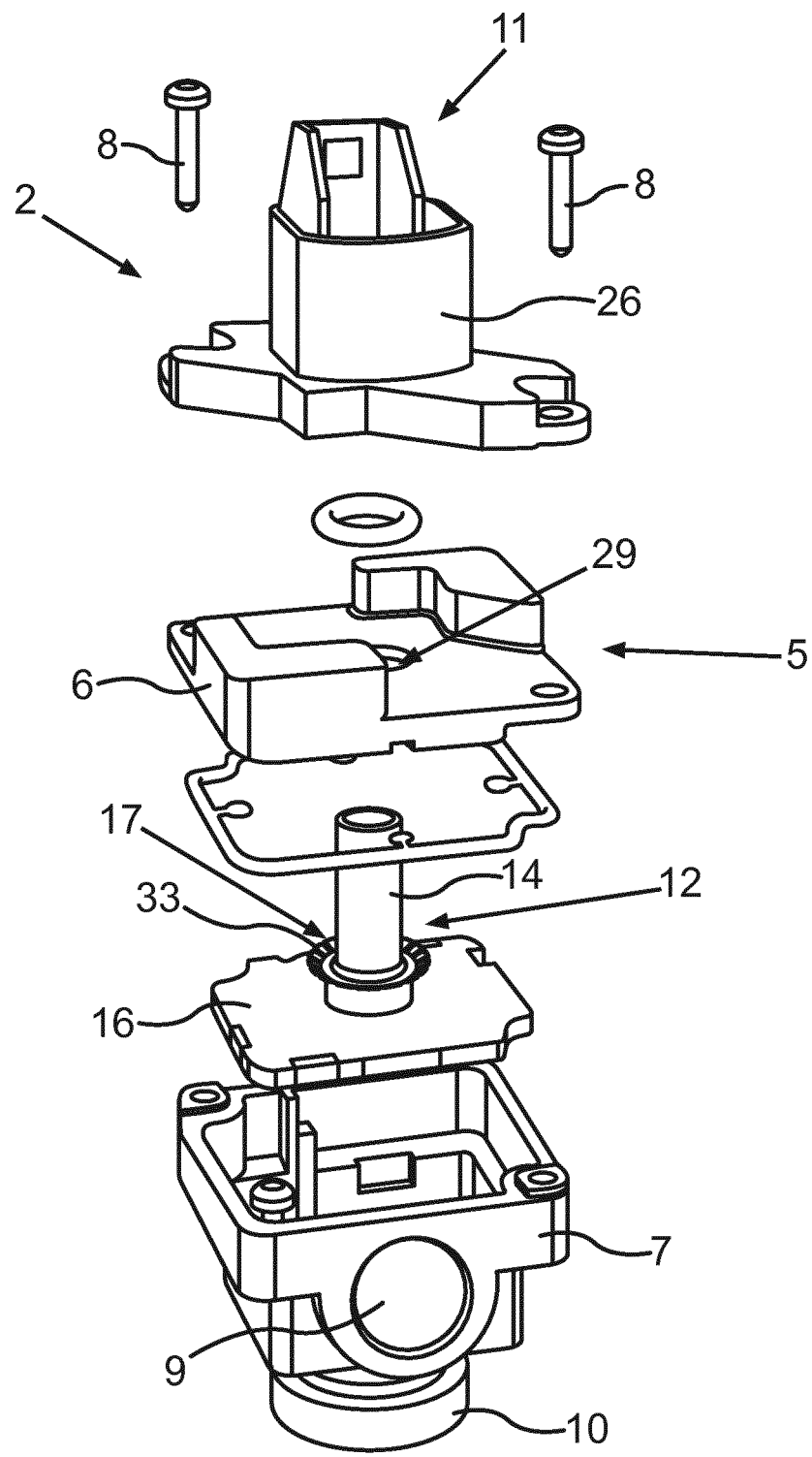

These show in:

FIG. 1 in schematic plan view an embodiment of a motor vehicle according to the invention with a camera;

FIG. 2 a perspective view of the camera with a housing and an interface device including a coaxial plug;

FIG. 3 a perspective view of a further embodiment of the camera with the housing and an interface device, which is configured as a high-speed data plug;

FIG. 4 a schematic exploded illustration of the camera with an opened housing, which includes a first housing part and a second housing part, and a connecting device;

FIG. 5 a schematic exploded illustration of the camera analogously to FIG. 4, but from another perspective;

FIG. 6 a schematic exploded illustration of a further embodiment of the camera with the opened housing and a connecting device with the high-speed data plug;

FIG. 7 a schematic exploded illustration of the camera analogously to FIG. 6, but from another perspective;

FIG. 8 a schematic sectional illustration of the camera analogously to FIG. 2, wherein the connecting device is electrically connected to an outer conductor of the interface device and the housing;

FIG. 9 a schematic sectional illustration of the camera analogously to FIG. 3, wherein the connecting device is electrically connected to the outer conductor and the housing;

FIG. 10 a schematic perspective view of a connecting device formed as ring with a base ring and several spring elements;

FIG. 11 a further schematic perspective view of a connecting device formed as ring with a first spring element part and a second spring element part of a spring element; and FIG. 12 a schematic explosive view of the camera with the connecting device formed as ring.

In FIG. 1, a plan view of a motor vehicle 1 with a camera 2 according to an embodiment of the invention is schematically illustrated. The arrangement of the camera 2 on the motor vehicle 1 is arbitrary, however preferably such that an environmental region 3 of the motor vehicle 1 and/or an internal area 4 of the motor vehicle 1 can be captured. The motor vehicle 1 can also include multiple such cameras 2. The camera 2 can be a CMOS (complementary metal-oxide-semiconductor) camera or else a CCD (charge-coupled device) camera or any image capturing device.

FIG. 2 shows a perspective view of the camera 2 in a first embodiment. In this embodiment, the camera 2 includes a housing 5 with a first housing part 6 and a second housing part 7. The first housing part 6 and the second housing part 7 are connected to each other by at least one screw 8 according to the embodiment. The first housing part 6 and/or the second housing part 7 can for example be manufactured from aluminum. According to the embodiment, the camera 2 furthermore includes a valve 9 and a lens 10.

In addition, the camera 2 has an interface device 11. The interface device 11 serves for data transfer and can be connected to a corresponding interface of a communication bus of the motor vehicle 1. The interface device 11 includes a coaxial plug 12 with an inner conductor 13 and an outer conductor 14. In addition, the interface device 11 has a connector envelope 26, which can for example be manufactured from plastic. The connector envelope 26 is in particular disposed outside of the housing 5. The connector envelope 26 for example serves for locking a cable harness of the motor vehicle 1, by which the camera 2 can be connected to the motor vehicle 1.

FIG. 3 shows a perspective view of the camera 2 in a second embodiment. Here too, the camera 2 has the housing 5 with the first housing part 6 and the second housing part 7. The first housing part 6 and the second housing part 7 are also connected by the screw 8. According to FIG. 3, the interface device 11 is formed as a high-speed data plug 15. The high-speed data plug 15 is for example configured for high-speed data transfer.

FIG. 4 shows the embodiment of the camera 2 according to FIG. 2 in an exploded illustration. Here, the first housing part 6 and the second housing part 7 are opened. A circuit board 16 is disposed within the housing 5. The coaxial plug 12 with the inner conductor 13 and the outer conductor 14 is disposed on the circuit board 16. According to the embodiment, the outer conductor 14 is connected to a ground potential of the camera 2. In order that the first housing part 6 is also electrically connected to the ground potential of the camera 2, a connecting device 17 is provided, which surrounds the outer conductor 14 in the assembled state of the camera 2.

According to FIG. 4, the connecting device 17 has a first annular element 18 and a second annular element 19. The first annular element 18 and the second annular element 19 are disposed spaced from each other. The first annular element 18 has a first through-opening 20, and the second annular element 19 has a second through-opening 21. The first through-opening 20 and the second through-opening 21 are disposed aligned with each other. This means, the first through-opening 20 and the second through-opening 21 are in alignment. The first annular element 18 and the second annular element 19 are connected by multiple spring elements 22. The spring elements 22 have a predetermined curvature such that the connecting device 17 obtains a spherical overall shape.

The outer conductor 14 has a first partial element 23 and a second partial element 24. The first partial element 23 has a smaller outer radius than the second partial element 24. Thus, the second partial element 24 disposed closer to the circuit board 16 than the first partial element 23 has a contact area 25. The contact area 25 is that part of the second partial element 24, which is located in the main extension direction of the circuit board 16 and thus is formed radially to the coaxial plug 12.

If the housing 5 is now closed by moving the first housing part 6 and the second housing part 7 towards each other, thus, the connecting device 17 abuts the contact area 25 of the second partial element 24 with the second annular element 19 and abuts the first housing part 6 or the inner side, thus the side of the first housing part 6 facing the circuit board 16, with the first annular element 18. By the abutment of the first annular element 18 and the second annular element 19, upon further approach of the first housing part 6 to the second housing part 7, an axial force is exerted on the connecting device 17 with respect to the coaxial plug 12. In particular, the force is received by the spring elements 22, which consequently are elastically deformed.

In the assembled state of the camera 2, the spring elements 22 thus establish the electrical connection between the outer conductor 14 and the first housing part 6. Thus, the first housing part 6 is also electrically connected to the ground potential of the camera 2. Therefore, the first housing part 6 acts shielding with respect to electromagnetic radiation.

In the assembled state, the first housing part 6 is electrically conductively connected to the second housing part 7 by means of the screw 8 according to the embodiment. Thus, there is also an electrical connection between the second housing part 7 and the ground potential of the camera 2. Thus, the second housing part 7 in particular also acts shielding with respect to electromagnetic radiation. Preferably, the housing 5 thus acts completely shielding with respect to electromagnetic radiation.

FIG. 5 shows the camera 2 analogously to FIG. 4 from another perspective. From the other perspective, an inner side 27 of the first housing part 6 is shown, which faces the circuit board 16. On the inner side 27 of the first housing part 6, according to the embodiment, a receiving element 28 is present. In the receiving element 28, the connecting device 17 can be disposed in certain areas. The connecting device 17 is disposed in the receiving element 28 in particular with the first annular element 18. Thus, the electrical connection between the first housing part 6 and the connecting device 17 can be provided. The receiving element 28 is abutted around a housing opening 29 of the first housing part 6. The coaxial plug 12 is led out of the interior of the camera 2 or the housing 5 through the housing opening 29. In the view of FIG. 5, the second through-opening 21 is also clearly shown, which incorporates the outer conductor 14 after fitting onto the coaxial plug 12.

FIG. 6 shows the camera 2 analogously to FIG. 3 in an exploded illustration. In this embodiment, the camera 2 includes the high-speed data plug 15. The high-speed data plug 15 results in the connector envelope 26 being disposed closer to the circuit board 16. This is allowed via a depression 30 on an outer side 31 of the first housing part 6. The outer side 31 is disposed opposite to the inner side 27. By the closer location of the housing opening 29 to the circuit board 16—compared to FIG. 5—the connecting device 17 is in particular formed as a serrated washer 32. According to the embodiment, the serrated washer 32 has internal teeth. Thus, the serrated washer 32 is in particular internally toothed. The teeth are preferably each formed as the spring element 22. Thus, the spring elements 22 according to FIG. 6 also can receive an axial force with respect to the coaxial plug 12 and provide it as the spring force. By providing the spring force, the electrical connection between the contact area 25 of the second partial element 24 of the outer conductor 14 and the inner side 27 of the first housing part 6 can be reliably provided even if a distance between the first housing part 6 and the contact area 25 varies in the range of the spring effect. Thus, the serrated washer 32 has spring elements 22 radially extending with respect to the coaxial plug 12 in its inner side. The spring elements 22 are preferably uniformly disposed on the serrated washer.

FIG. 7 shows the camera 2 analogously to FIG. 6, also in an exploded illustration, but in another perspective. The connecting device 17 as the serrated washer 32 is located between the first housing part 6 and the second housing part 7. The serrated washer 32 has internal spring elements 22. The serrated washer 32 abuts the inner side 27 of the first housing part 6 with one side. Furthermore, the serrated washer 32 abuts the second partial element 24 with the opposing side. Thus, an electrical connection of the outer conductor 14 and the first housing part 6 is established. Thus, the first housing part 6 now is also electrically conductively connected to the ground potential of the camera 2. In case of the embodiment according to FIG. 7 with the high-speed data plug 15, the first housing part 6 preferably does not have a receiving element 28. The area in the region of the housing opening 29 on the inner side 27 of the first housing part 6 is in particular flat.

FIG. 8 shows a sectional illustration analogously to the embodiment of FIG. 2. The first housing part 6 and the second housing part 7 are combined such that the housing 5 is closed. The connecting device 17 is now applied with an axial force with respect to the coaxial plug 12. The respective spring elements 22 yield in radial direction with respect to the coaxial plug 12 or the spring elements 22 bounce in radial direction with respect to the coaxial plug 12. By the spring force of the spring elements 22, the first annular element 18 and the second annular element 19 are pressed apart from each other or departed from each other such that the first annular element 18 is pressed to the receiving element 28 of the first housing part 6 and the second annular element 19 is pressed to the contact area 25 of the second partial element 24 of the outer conductor 14. Thus, the first housing part 6 and the outer conductor 14 are electrically connected by means of the connecting device 17.

FIG. 9 shows a schematic sectional illustration of the camera 2 analogously to the embodiment of FIG. 3. By the high-speed data plug 15, the first housing part 6 is closer to the second housing part 7 compared to the embodiment of FIG. 8. The electrical connection between the first housing part 6 and the contact area 25 of the second partial element 24 of the outer conductor 14 is provided by means of the serrated washer 32. The serrated washer 32 has the spring elements 22, which are disposed as teeth on the serrated washer 32 and are distorted such that they are disposed to the bottom in axial direction with respect to the coaxial plug 12, thus towards the circuit board 16, and/or to the top, thus away from the circuit board 16. By the spring elements 22, thus, a force can also be received in axial direction with respect to the coaxial plug 12. Thereby, the connecting device 17 can in particular permanently be pressed to the first housing part 6 and the outer conductor 14 by the spring force of the biased spring elements 22. According to the embodiment of FIG. 9 with the high-speed data plug 15, the coaxial plug 12 has four inner conductors 13, of which two can be seen in the sectional view.

FIG. 10 shows the connecting device 17 formed as a ring 33 in a perspective view. The ring 33 has a base ring 34 and the spring elements 22. The spring elements 22 are arranged on an outer side 36 of the base ring 34 facing away from a longitudinal axis 35 of the ring 33. Further the spring elements are arranged to protrude radially from the base ring 34. The spring elements 22 extend at an angle 37 relative to a plane 38, in which the base ring 34 extends. The angle 37 preferably amounts to 30° to 80°, in particular 30° to 50°. Thereby the ring 33 with the spring elements 22 is formed to be crown cap-like.

The spring elements 22 oriented at the angle 37 relative to the plane 38 moreover have an edgeless spring element surface 39. The spring element surface 39 is provided on the side of the spring element 22, which in the assembled state of the camera 2 is oriented towards the inner side 27 of the first housing part 6 of the housing 5. The spring element surface 39 can also be described as being devoid of bends.

FIG. 11 shows the connection device 17 formed as ring 33 in the perspective view of a further embodiment. The spring elements each have a first spring element part 40. The first spring element part 40 in each case is oriented radially outward at a first angle 41 relative to the longitudinal axis 35 of the ring 33. The first angle 41 therein can amount for instance to 10° to 60°, in particular to 40° to 60°. From an end 42 of each of the first spring element parts 40 facing away from the base ring 34 a second spring element part 43 extends. The second spring element part 43 is oriented at a second angle 44 larger than the first angle 41 relative to the longitudinal axis 35 of the ring 33.

The spring elements 22 according to the embodiment of FIG. 11 are bent once at the second angle 44.

In FIG. 10 and FIG. 11 the spring elements 22 are arranged circumferentially around the longitudinal axis 35 of the ring 33. Between the spring elements 22 in each case a clearance 45 is formed. The spring elements 22 consequently are arranged in the circumferential direction relative to the longitudinal axis 35 of the ring 33 at least partly spaced apart. The clearance 45 starts at a distance 46 from the base ring 34 and extends radially outward from the base ring 34 after the distance 46. The distance 46 in the embodiment of FIG. 10 is smaller than this is the case in the embodiment of FIG. 11.

FIG. 12 shows the camera 2 with the connecting device 17 formed as ring 33. The camera 2 is shown in an explosive view. The ring 33 extends around the coaxial plug 12 of the interface device 11. If the first housing part 6 of the housing 5 during assembly of the camera 2 is attached, thereby a force is exerted upon the spring elements 22 of the ring 33 in axial direction relative to the longitudinal axis 35 of the ring 33. The axial force causes the ring 33 to be pressed upon the contact area 25 of the second partial element 24 of the outer conductor 14. Thereby an electrical connection is established between the first housing part 6 of the housing 5 and the interface device 11. By establishing the electrical connection the housing 5 is connected with the ground potential of the camera 2 and can thereby provide an improved electromagnetic shield effect. The ring 33 is disposed in the assembled state of the camera 2 in such a way to the outer conductor 14, that the spring elements 22 protrude out of the plane 38, in which the base ring 34 extends, toward the inner side 27 of the first housing part 6. The base ring 34 lies on the contact area 25 of the second partial element 24 of the outer conductor 14.

By the ring 33 both an axial tolerance between the contact area 25 and the inner side 27 of the first housing part 6 can be provided, as well as a pressure load that is compatible with the circuit board 16.

The invention claimed is:

1. A camera for a motor vehicle comprising:
a housing configured to shield electromagnetic radiation at least in certain areas;
a circuit board disposed in the housing; and
an interface device for connecting the camera to the motor vehicle, wherein the interface device is electrically connected to the circuit board,
wherein the interface device includes a coaxial plug with an inner conductor and an outer conductor and the camera has a connecting device for electrically connecting the outer conductor to the housing,
wherein the connecting device has several spring elements, which exert a spring force on the housing and/or the outer conductor in the assembled state of the camera and is formed as a ring, which comprises a base ring, and
wherein the spring elements are arranged on an outer side of the base ring facing away from a longitudinal axis of the ring.

2. The camera according to claim 1, wherein the connecting device is formed elastically deformable.

3. The camera according to claim 1, wherein the spring elements are arranged radially protruding from the base ring and are oriented at an angle relative to a plane, in which the base ring extends.

4. The camera according to claim 3, wherein the spring elements oriented at an angle relative to the plane each have an edgeless spring element surface.

5. The camera according to claim 1, wherein the spring elements each have a first spring element part, which is oriented radially outward at a first angle relative to the longitudinal axis of the ring, and on an end of each of the first spring element parts, which faces away from a base ring, a second spring element part extends, which is oriented at a second angle larger than the first angle relative to the longitudinal axis of the ring.

6. The camera according to claim 1, wherein the spring elements are arranged circumferentially around the longitudinal axis of the ring, and between the spring elements each a clearance is formed, which extends radially outward, starting at a distance, from the base ring.

7. The camera according to claim 1, wherein the connecting device surrounds the outer conductor at least in some areas.

8. The camera according to claim 1, wherein the at least one spring element has a predetermined curvature.

9. The camera according to claim 1, wherein the outer conductor includes a first partial element and a second partial element disposed between the first partial element and the circuit board, wherein a first outer radius of the first partial element is less than a second outer radius of the second partial element.

10. The camera according to claim 1, wherein the housing has a receiving element on an inner side facing the circuit board, in which the connecting device is disposed at least in certain areas and which is electrically connected to the connecting device.

11. The camera according to claim 1, wherein the housing includes a first housing part and a second housing part, wherein the first housing part is electrically connected to the connecting device and to the second housing part.

12. The camera according to claim 1, wherein the outer conductor is electrically connected to a ground potential of the camera.

13. A motor vehicle with a camera according to claim 1.

* * * * *